United States Patent
Wu

(10) Patent No.: US 12,310,003 B2
(45) Date of Patent: May 20, 2025

(54) SEMICONDUCTOR DEVICE AND METHOD OF MAKING THE SAME

(71) Applicant: CHANGXIN MEMORY TECHNOLOGIES, INC., Anhui (CN)

(72) Inventor: Pingheng Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 616 days.

(21) Appl. No.: 17/593,829

(22) PCT Filed: Jun. 19, 2020

(86) PCT No.: PCT/CN2020/097170
§ 371 (c)(1),
(2) Date: Sep. 24, 2021

(87) PCT Pub. No.: WO2021/103505
PCT Pub. Date: Jun. 3, 2021

(65) Prior Publication Data
US 2022/0173110 A1    Jun. 2, 2022

(30) Foreign Application Priority Data

Nov. 29, 2019   (CN) .......................... 201911207283.6

(51) Int. Cl.
*H10B 12/00*    (2023.01)
*H01L 21/762*   (2006.01)
*H10D 62/10*    (2025.01)

(52) U.S. Cl.
CPC ........... *H10B 12/34* (2023.02); *H01L 21/762* (2013.01); *H10B 12/053* (2023.02); *H10B 12/488* (2023.02); *H10D 62/115* (2025.01)

(58) Field of Classification Search
None
See application file for complete search history.

(56) References Cited

U.S. PATENT DOCUMENTS 9,852,031 B2    12/2017   Mizutani et al.
2010/0200948 A1   8/2010   Kim et al.
(Continued)

FOREIGN PATENT DOCUMENTS

CN    106960847 A    7/2017
CN    108695327 A    10/2018
(Continued)

OTHER PUBLICATIONS

PCT/CN2020/097170 International Search Report mailed Sep. 24, 2020, English Translation.
(Continued)

*Primary Examiner* — Hung K Vu
(74) *Attorney, Agent, or Firm* — Kilpatrick Townsend & Stockton LLP

(57) ABSTRACT

The method making a semiconductor device includes: providing a substrate having a shallow trench isolation region and an active region, patterned with trenches; and forming a word line conductive layer partly located in the trench; forming a first insulating film on the word line conductive layer, and forming an air gap structure in the trench in the first insulating film by controlling the step coverage of the first insulating film; removing the first insulating film from the substrate surface to form a first insulating layer, which embeds the air gap structure. The air gap structure in the first insulating layer on the word line conductive layer reduces the overall dielectric constant of the insulating material between the word line conductive layer and other conductive layers, so as to achieve the purpose of reducing the parasitic capacitance between the word line conductive layer and other conductive layers, thereby mitigating the influence of the parasitic capacitance on the device performance parameters.

17 Claims, 11 Drawing Sheets

(56) References Cited

U.S. PATENT DOCUMENTS

2018/0108662 A1* 4/2018 Cho .................. H01L 28/90
2018/0301456 A1* 10/2018 Cho .................. H10B 12/34

FOREIGN PATENT DOCUMENTS

| CN | 108807401 A | 11/2018 |
| CN | 109192728 A | 1/2019 |
| WO | WO 2021/103505 A1 | 6/2021 |

OTHER PUBLICATIONS

EP Application No. 20 893 359.8 Communication pursuant to Art. 94(3) mailed Jan. 12, 2023.

* cited by examiner

SEMICONDUCTOR DEVICE AND METHOD OF MAKING THE SAME

TECHNICAL FIELD

The present invention relates to the field of semiconductor technology, in particular to a semiconductor device and a manufacturing method of the semiconductor device.

BACKGROUND

There is parasitic capacitance between the conductive layers of a dynamic random access memory device. As sizes of dynamic random access memory devices shrink and data storage speed increases, the parasitic capacitance between conductive layers has been playing more significant effects on the performance of the devices.

SUMMARY

It is necessary to provide a method for manufacturing a semiconductor device and a semiconductor device to address the above-mentioned disadvantages.

The disclosure provides a method for manufacturing a semiconductor device, comprising steps of: providing a substrate comprising a shallow trench isolation region and an active region on a top surface; forming trenches in the shallow trench isolation region and in the active region respectively; forming a word line conductive layer on the substrate, wherein a part of the word line conductive layer is located in the trenches; forming a first insulating film on the word line conductive layer; forming an air gap structure in the first insulating film in the trench by controlling a step coverage of the first insulating film; and removing the first insulating film from the top surface of the substrate to form a first insulating layer, wherein the first insulating layer embeds the air gap structure.

In some embodiments, the air gap structure in the first insulating layer comprises a first air gap structure in the shallow trench isolation region and a second air gap structure in the active region. wherein a depth of the first air gap structure is less than or equal to a depth of the second air gap structure.

In some embodiments, a shape of the air gap structure comprises at least one of a short pipe shape, a long line shape, and an elliptical shape. In some embodiments, an aspect ratio of height to width of a cross section of the air gap structure is greater than or equal to 1.3 and less than or equal to 5.0.

In some embodiments, the step of forming a word line conductive layer on the substrate comprises: forming a conductive film on the top surface of the substrate and the trenches; and etching an excess conductive film from the top surface of the substrate and the trench to form a word line conductive layer.

In some embodiments, the trenches comprise a first trench located in the shallow trench isolation region and a second trench located in the active region, wherein a depth of the first trench is greater than or equal to a depth of the second trench, and a width of the first trench is greater than or equal to a width of the second trench.

In some embodiments, the air gap structure is located in the second trench.

In some embodiments, the semiconductor device is a dynamic random access memory.

The above-mentioned manufacturing method includes: providing a substrate having a shallow trench isolation region and an active region; etching the shallow trench isolation region and the active region to form trenches; forming a word line conductive layer on the substrate, where a part of the word line conductive layer is located in the trench forming a first insulating film on the word line conductive layer, and where depositing the first insulating film is controlled to cover the first insulating film; forming an air gap structure is in an insulating film, where the air gap structure is located in the trench; removing the first insulating film from the surface of the substrate to form a first insulating layer, and the first insulating layer embeds the air gap structure. In this application, by controlling the step coverage of the first insulating film, an air gap structure is formed in the first insulating layer on the word line conductive layer located in the trench, thereby reducing the overall dielectric constant of material between the word line conductive layer and other conductive layers, so as to achieve the purpose of reducing the parasitic capacitance between the word line conductive layer and other conductive layers, and to mitigate the influence of the parasitic capacitance on the device performance parameters.

The disclosure also provides a semiconductor device, comprising: a substrate, a shallow trench isolation region and an active region formed on the substrate; trenches formed in the shallow trench isolation region and the active region; a word line conductive layer located on the substrate, wherein a part of the word line conductive layer is located in the trenches; a first insulating layer disposed on the word line conductive layer, wherein a portion of the first insulating layer located in the trenches comprises an air gap structure, wherein the first insulating layer embeds the air gap structure in the trenches.

In some embodiments, the air gap structure in the first insulating layer comprises a first air gap structure in the shallow trench isolation region and a second air gap structure in the active region, wherein a depth of the first air gap structure is less than or equal to a depth of the second air gap structure.

In some embodiments, a shape of the air gap structure includes at least one of a short pipe shape, a long line shape, and an elliptical shape. an aspect ratio of height to width of a cross section of the air gap structure is greater than or equal to 1.3 and less than or equal to 5.0.

In some embodiments, the semiconductor device is a dynamic random access memory.

The semiconductor device described above includes: a substrate on which a shallow trench isolation region and an active region are formed; trenches formed on both the shallow trench isolation region and the active region; a word line conductive layer located on the substrate, part of the word line conductive layer is located in the trench; a first insulating layer located on the word line conductive layer, an air gap structure formed in a portion of the insulating layer located in the trench, and the first insulating layer embeds the air gap structure. In the present application, an air gap structure is formed in the first insulating layer on the word line conductive layer in the trench to reduce the overall dielectric constant of the insulating material between the word line conductive layer and other conductive layers. The purpose is to reduce parasitic capacitance between the word line conductive layer and other conductive layers, thereby reducing impact of the parasitic capacitance on the device performance parameters.

It should be understood that the above general description and the following detailed description are only exemplary and cannot limit the present disclosure.

BRIEF DESCRIPTION OF THE DRAWINGS

By describing its exemplary embodiments in detail with reference to the accompanying drawings, the above and other objectives, features and advantages of the present disclosure will become more apparent.

DETAILED DESCRIPTION OF THE PREFERRED EMBODIMENTS

Figure 1:
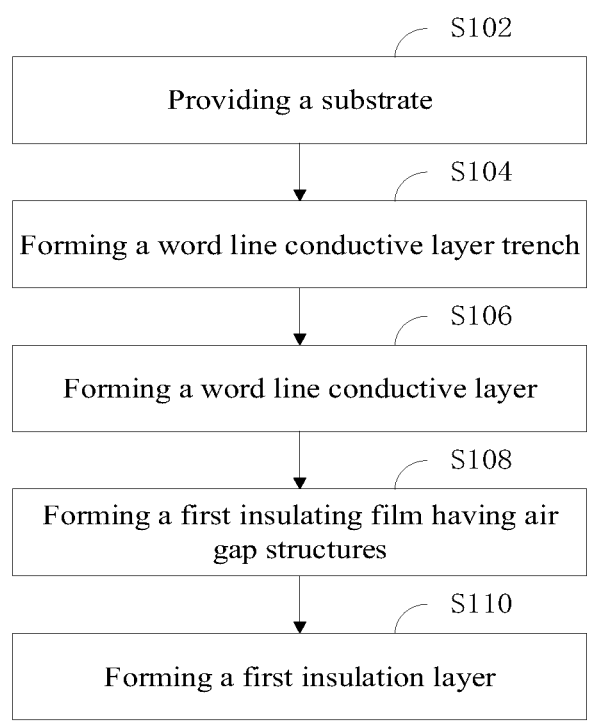
FIG. 1 is a flowchart of a manufacturing method of a semiconductor device according to an embodiment.

Implementations of the present disclosure are illustrated below through specific embodiments. Those skilled in the art can easily understand other advantages and efficacy of the present disclosure according to the content disclosed in this specification. The present disclosure can also be implemented or applied through other different specific implementations. Various modifications or variations can also be made on details in this specification based on different opinions and applications without departing from the spirit of the present disclosure.

It should be noted that, the figures provided in this embodiment merely illustrate the basic conception of the present disclosure schematically. Therefore, the figures only show components related to the present disclosure, and are not drawn according to the quantity, shapes and sizes of components during actual implementation. The pattern, quantity and ratio of components during actual implementation can be changed arbitrarily, and the component layout may also be more complex.

In order to facilitate the understanding of the present invention, the present invention will be described more fully below with reference to the relevant drawings. The preferred embodiment of the invention is shown in the drawings. However, the present invention can be implemented in many different forms and is not limited to the embodiments described herein. On the contrary, the purpose of providing these embodiments is to make the disclosure of the present invention more thorough and comprehensive.

Unless otherwise defined, all technical and scientific terms used herein have the same meaning as commonly understood by those skilled in the technical field of the present invention. The terms used in the specification of the present invention herein are only for the purpose of describing specific embodiments, and are not intended to limit the present invention. The term "and/or" as used herein includes any and all combinations of one or more related listed items.

It should be understood that when an element or layer is referred to as being "on", "adjacent to", "connected to" or "coupled to" other elements or layers, it can be directly on the other elements or layers. On a layer, adjacent to, connected or coupled to other elements or layers, or intervening elements or layers may be present. In contrast, when an element is referred to as being "directly on", "directly adjacent to", "directly connected to" or "directly coupled to" other elements or layers, there are no intervening elements or Floor. It should be understood that although the terms first, second, third, etc. may be used to describe various elements, components, regions, layers and/or sections, these elements, components, regions, layers and/or sections should not be limited by these terms. These terms are only used to distinguish one element, component, region, layer or section from another element, component, region, layer or section. Therefore, without departing from the teachings of the present invention, the first element, component, region, layer or section discussed below may be represented as a second element, component, region, layer or section.

Spatial relation terms such as "under", "below", "below", "below", "above", "above", etc., in It can be used here for the convenience of description to describe the relationship between one element or feature shown in the figure and other elements or features. It should be understood that, in addition to the orientations shown in the figures, the spatial relationship terms are intended to include different orientations of devices in use and operation. For example, if the device in the drawing is turned over, then elements or features described as "under" or "under" or "under" other elements will be oriented "on" the other elements or features. Therefore, the exemplary terms "below" and "below" can include both an orientation of above and below. The device can be otherwise oriented (rotated by 90 degrees or other orientation) and the spatial descriptors used here are interpreted accordingly.

The purpose of the terms used here is only to describe specific embodiments and not as a limitation of the present invention. When used herein, the singular forms of "a", "an" and "the/the" are also intended to include plural forms, unless the context clearly indicates otherwise. It should also be understood that the terms "composition" and/or "including", when used in this specification, determine the existence of the described features, integers, steps, operations, elements and/or components, but do not exclude one or more other The presence or addition of features, integers, steps, operations, elements, components, and/or groups. As used herein, the term "and/or" includes any and all combinations of related listed items.

The embodiments of the invention are described here with reference to cross-sectional views which are schematic diagrams of ideal embodiments (and intermediate structures) of the invention. In this way, changes from the shown shape due to, for example, manufacturing technology and/or tolerances can be expected. Therefore, the embodiments of the present invention should not be limited to the specific shapes of the regions shown here, but include shape deviations due to, for example, manufacturing. For example, the implanted area shown as a rectangle usually has round or curved features and/or implant concentration gradients at its edges, rather than a binary change from an implanted area to a non-implanted area. Likewise, the buried region formed by the implantation can result in some implantation in the region between the buried region and the surface through which the implantation proceeds. Therefore, the regions shown in the figure are schematic in nature, and their shapes are not intended to show the actual shape of the regions of the device and are not intended to limit the scope of the present invention.

There are parasitic capacitances between the embedded word line conductive layer and the bit line conductive layer, the bit line contact conductive layer, and the capacitance contact conductive layer in the active areas of the dynamic random access memory device. As size of the dynamic random access memory device shrinks and data access speed increases, the parasitic capacitances between the embedded word line conductive layer and the bit line conductive layer, the bit line contact conductive layer, and the capacitive contact conductive layer will have more significant effects on the device characteristics. To ensure device performance, the parasitic capacitance effects between these conductive layers need to be reduced.

As shown in FIGS. 1, 2a-2c, and 3a-3c, according to an embodiment, the method for manufacturing a semiconductor device includes the following steps:

S102: providing a substrate.

The provided substrate has a shallow trench isolation region 102 and an active region 202 formed on the substrate. The material of the substrate may be at least one of silicon, silicon on insulator (SOI), stacked silicon on insulator (SSOI), stacked silicon germanium on insulator (SSiGeOI), silicon germanium on insulator (SiGeOI), germanium on insulator (GeOI), etc.

S104, forming a word line conductive layer trench.

The shallow trench isolation region 102 and the active region 202 are respectively etched to form trenches, and the trenches are used to subsequently form a word line conductive layer. In one embodiment, trenches are formed in the shallow trench isolation region and the active region by wet etching. In another embodiment, the trenches are formed in the shallow trench isolation region and the active region by dry etching.

S106, forming a word line conductive layer.

A word line conductive layer 110 is formed on the substrate, and a part of the word line conductive layer 110 is located in the trench. In one embodiment, before forming the word line conductive layer 110, the method further includes forming an insulating layer 106 on the inner wall of the trench. The insulating layer 106 may be a silicon oxide film layer.

Figure 4:
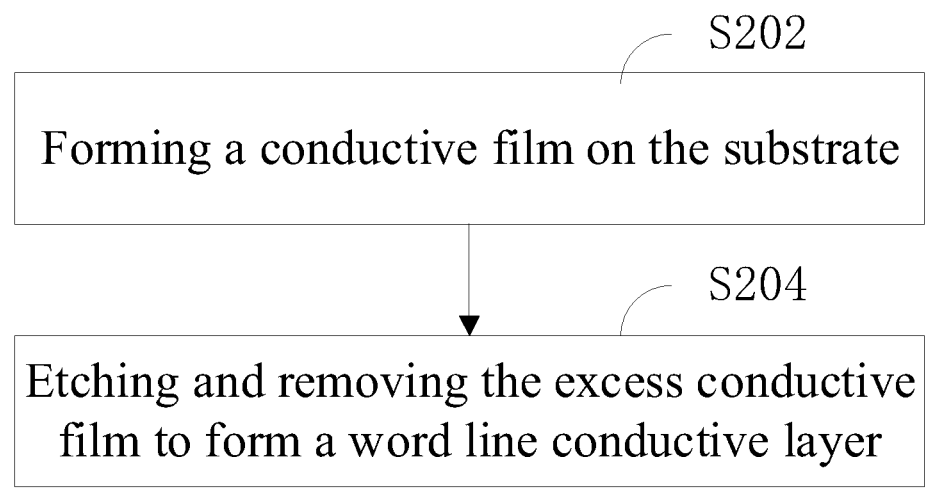
FIG. 4 is a flowchart of forming a word line conductive layer according to an embodiment.

As shown in FIG. 4, in one embodiment, step S106 includes:

S202, forming a conductive film on the substrate.

In one embodiment, before forming the conductive film, it further includes forming a first metal layer 108 on the inner wall of the trench. For example, the first metal layer may be a titanium/titanium nitride metal layer for adhesion and as a barrier.

In one embodiment, the conductive film is formed by a plasma chemical vapor deposition process. In one embodiment, the conductive film is formed by a physical vapor deposition process. In one embodiment, the conductive film is a metal conductive film, such as a metal tungsten film, a metal tungsten composite film, a metal aluminum film, and the like.

S204, etching and removing the excess conductive film to form a word line conductive layer.

The excess conductive film on the surface of the substrate and the trench is etched to form the word line conductive layer 110. In one embodiment, the excess conductive film is removed by etching, and part of the first metal layer on the inner wall of the trench is removed.

S108, forming a first insulating film having air gap structures.

Figure 2A:
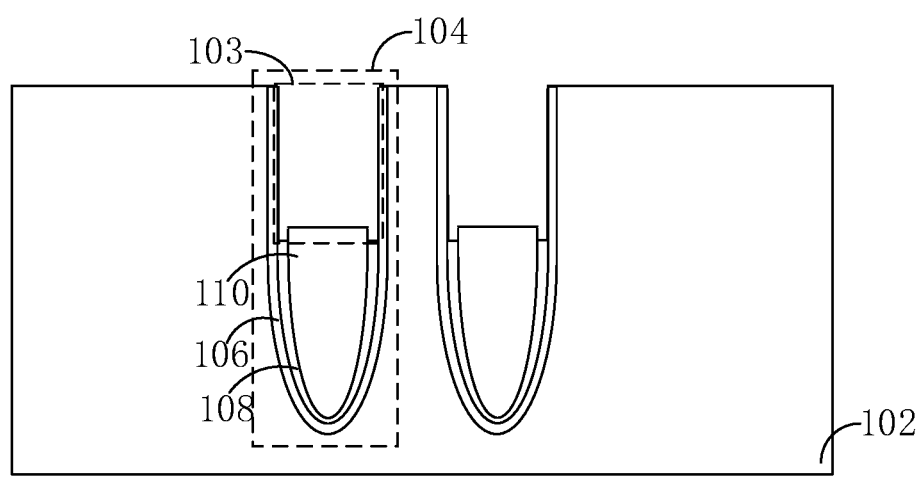
FIG. 2a is a cross-sectional view of a first trench in a shallow trench isolation region cut along a vertical direction of the word line conductive layer, after forming a word line conductive layer, according to an embodiment.
Figure 2B:
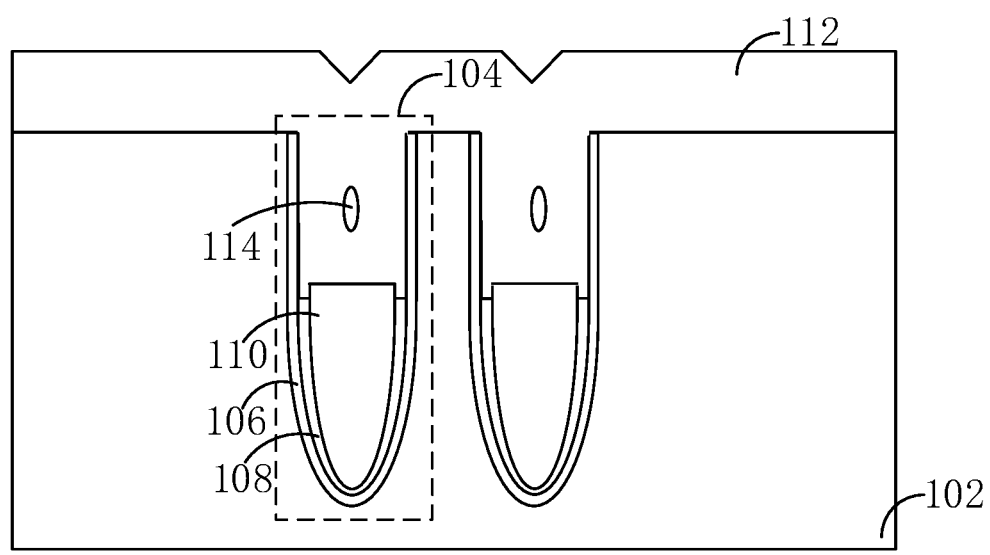
FIG. 2b is a cross-sectional view of the first trench in the shallow trench isolation region in FIG. 2a after the first insulating film is formed according to an embodiment.
Figure 3A:
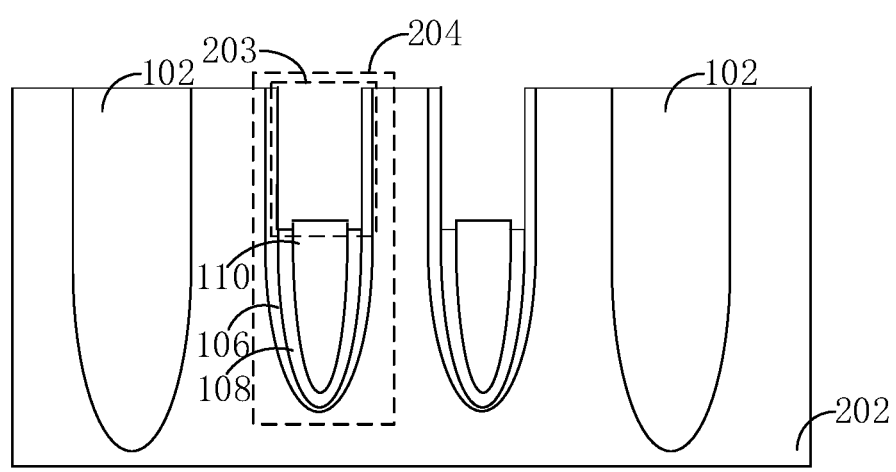
FIG. 3a is a cross-sectional view of a second trench in the active region cut along a vertical direction of the word line conductive layer, after the word line conductive layer is formed, according to an embodiment.
Figure 3B:
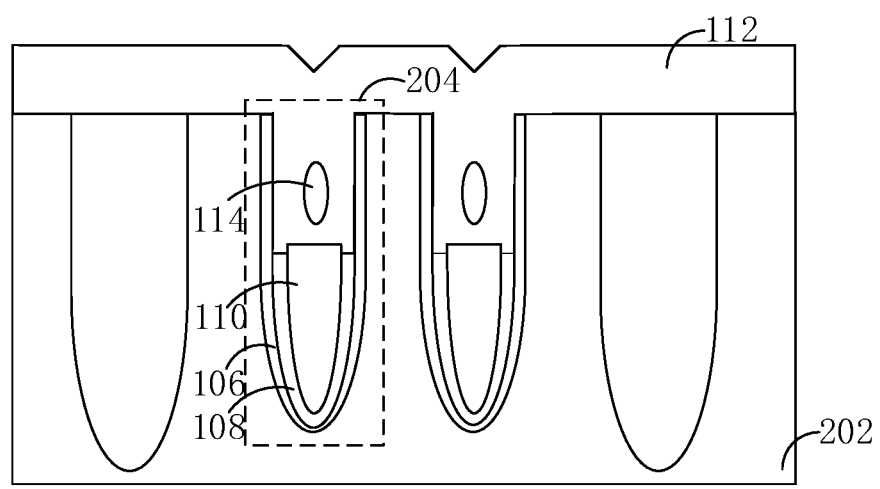
FIG. 3b is a cross-sectional view of the second trench in the active region in FIG. 3a after the first insulating film is formed, according to an embodiment.

As shown in FIGS. 2b and 3b, a first insulating film 112 is formed on the word line conductive layer 110, and an air gap structure 114 is formed in the first insulating film 112 by controlling the step coverage of the first insulating film 112, the air gap 114 is located in the trench.

In an embodiment, the first insulating film includes at least one of the high dielectric constant materials such as silicon dioxide, silicon nitride, silicon oxynitride and silicon carbide.

In one embodiment, the first insulating film is formed by chemical vapor deposition. The step coverage of the film is achieved by controlling the process parameters during the deposition of the first insulating film, such as changing the reaction temperature and deposition speed, etc. thus that an air gap structure is formed in the first insulating film located in the trench.

S110, forming a first insulating layer.

Figure 2C:
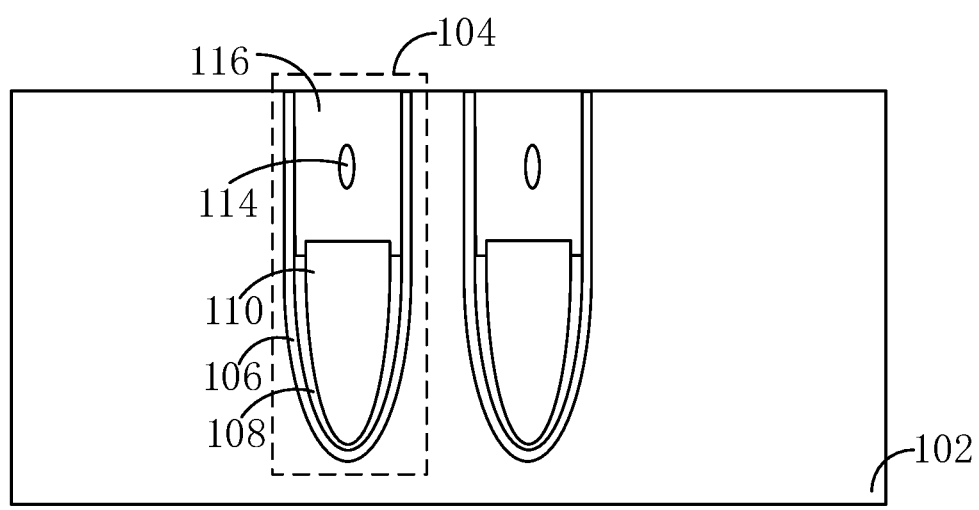
FIG. 2c is a cross-sectional view of the first trench in the shallow trench isolation region in FIG. 2b after the first insulating layer is formed according to an embodiment.
Figure 3C:
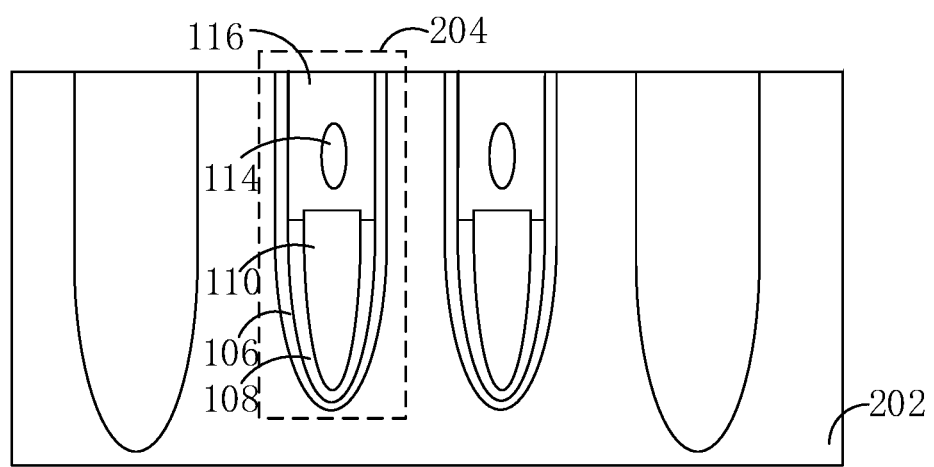
FIG. 3c is a cross-sectional view of the second trench in the active region in FIG. 3b after the first insulating layer is formed according to an embodiment.

As shown in FIGS. 2c and 3c, the first insulating film on the surface of the substrate is removed to form a first insulating layer 116, and the first insulating layer 116 surrounds the air gap structure 114.

In one embodiment, the first insulating layer 116 includes at least one of the high dielectric constant materials such as silicon dioxide, silicon nitride, silicon oxynitride, and silicon carbide.

In one embodiment, the first insulating layer is formed after removing the excess first insulating film on the surface of the substrate by one of the methods at least including dry etching, wet etching, and chemical mechanical polishing.

In one embodiment, the air gap structure in the first insulating layer includes a first air gap structure located in the shallow trench isolation region and a second air gap structure located in the active region, and the depth of the first air gap structure is less than or equal to the depth of the second air gap structure.

In one embodiment, the trench includes a first trench 104 located in the shallow trench isolation region 102 and a second trench 204 located in the active region 202, and the depth of the first trench 104 is greater than or equal to the second trench 204. The width of the first trench 104 is greater than or equal to the width of the second trench 204. In one embodiment, the aspect ratio of depth to width of the first trench 104 is less than or equal to the aspect ratio of depth to width of the second trench 204. In one embodiment, the aspect ratio of depth to width of the first trench 104 is greater than the aspect ratio of depth to width of the second trench 204.

In one embodiment, the first trench 104 and the second trench 204 are formed by different processes.

In an embodiment, the shape of the air gap structure includes at least one of a long shape (an air line), a short pipe shape (an air pipe), and an elliptical shape (an air gap). The air gap structure of different shapes is fabricated in the first insulating layer by controlling the degree of side etching of the first trench in the shallow trench isolation region. At the same time, it should be avoiding the formation of an air gap structure above the word line contact landing area 115 (see FIG. 5a). The word line contact landing area refers to the end of the word line conductive layer which is used to lead out part of the word line conductive layer through the word line contact hole, thus to avoid the formation of abnormal open window on the air gap structure during the subsequent formation of the word line contact hole, or the forming the air gap structure in the first insulating layer on the sidewall of the word line contact hole, thereby resulting a bad interconnection lines formed between layers, so to affect the device performance.

As shown in FIGS. 2a and 3a, after the word line conductive layer 110 is formed in step 204 disclosed in FIG. 4, the word line conductive layer 110 divides the first trench 104 into two parts, one part has the word line conductive layer 110 formed and another part has a third trench 103, and also divides the second trench 204 into a part having the word line conductive layer 110 formed and a fourth trench 203.

In an embodiment, the aspect ratios of depth to width of the third trench 103 in the shallow trench isolation region 102 and the aspect ratios of depth to width of the fourth trench 203 in the active region 202 are both greater than 1.5, and the air gap structure in the first insulating layer has a continuous long strip shape (an air line).

In an embodiment, the aspect ratio of depth to width of the third trench 103 in the shallow trench isolation region 102 is less than 1.5 and greater than 1.0, the aspect ratio of depth to width of the fourth trench 203 in the active region 202 is greater than 1.5, and the air gap structure in the first insulating layer is an intermittent short pipe shape (an air pipe).

In one embodiment, the aspect ratio of depth to width of the third trench 103 in the shallow trench isolation region 102 is less than 1.0, the aspect ratio of depth to width of the fourth trench 203 in the active region 202 is greater than 1.5, and the air gap structure in the first insulating layer has an independent elliptical shape (an air gap).

Figure 5A:
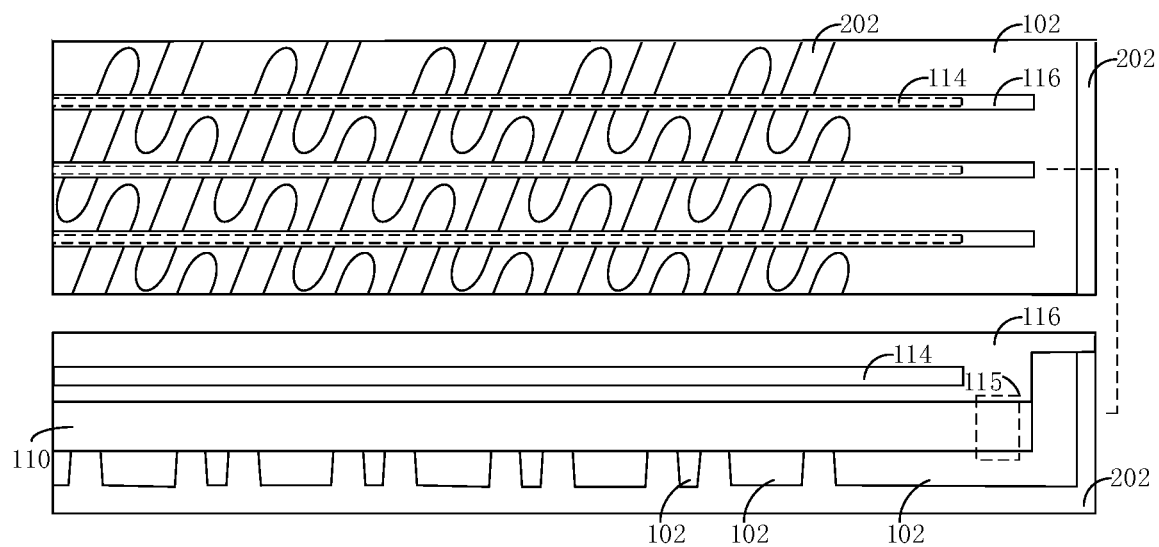
FIG. 5a is a top view and a cross-sectional view of the air gap structures along the word line conductive layer according the first embodiment.

As shown in FIG. 5a, in one embodiment, the air gap structure 114 in the first insulating layer 116 has a long line shape (an air line). By adjusting the step coverage of the first insulating film, a large seal (overhand/overhead seal) is formed in the first insulating layer over the word line conductive layer 110. The dielectric constant of air is 1.001, which is close to the dielectric constant of vacuum. A long strip of air (air line) formed in the first insulating layer above the word line conductive layer drops the dielectric constant of the first insulating layer above the word line conductive layer so plays as a low-dielectric constant material effect, therefore reducing the parasitic capacitance between the word line conductive layer and the bit line conductive layer, the bit line contact conductive layer, and the capacitor contact conductive layer. The parasitic capacitance from overall dielectric constant of the insulating materials therebetween is reduced, and the influence of the parasitic capacitance over the device parameters is reduced.

Figure 5B:
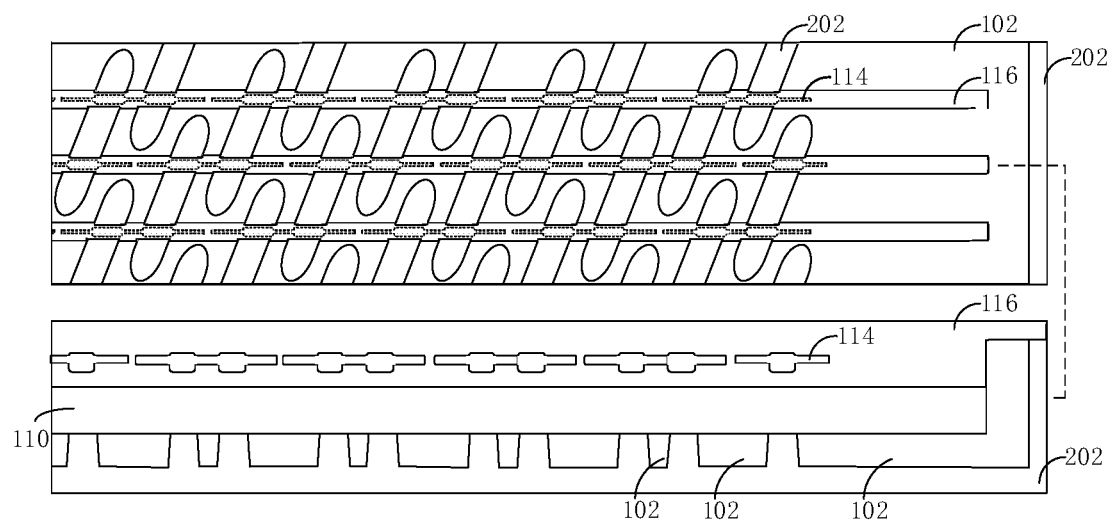
FIG. 5b is a top view and a cross-sectional view of the air gap structures along the word line conductive layer according to the second embodiment.

As shown in FIG. 5b, in one embodiment, the air gap structure 114 in the first insulating layer 116 has the shape of a short pipe (an air pipe) to control the degree of sidewall etching of the first trench in the shallow trench isolation region, so the opening of the first trench is slightly expanded. The step coverage of the first insulating film is adjusted to improve the filling ability of the first insulating film in the first trench as the opening is slightly expanded, thereby reducing the cross-sectional area of the air gap structure. The air gap structure in the first insulating layer has the shape of a short pipe. The dielectric constant of air is 1.001, which is close to vacuum's dielectric constant. A short pipe-shaped air gap is formed in the first insulating layer above the conductive layer of the word line structure (air pipe), so that the part of the first insulating layer containing the air gap structure above the word line conductive layer includes the effect of a low-dielectric constant material, thereby the overall dielectric constant of the insulating material is reduced, and the parasitic capacitance among the word line conductive layer, the bit line contact conductive layer, and the capacitor contact conductive layer has been reduced as well. However, the short pipe-shaped air gap structure has less effect on the parasitic capacitance between the word line conductive layer and the bit line conductive layer, thereby reducing the capacitance value of the parasitic capacitance between the word line conductive layer and the bit line contacting conductive layer and the capacitor contacting the conductive layer, also has influence to the parasitic capacitance on the device performance parameters.

Figure 5C:
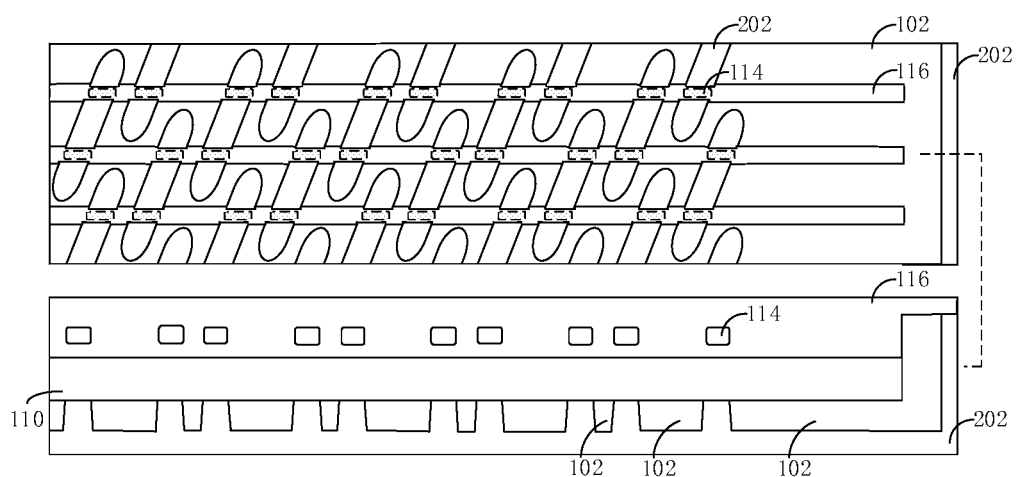
FIG. 5c is a top view and a cross-sectional view of the air gap structures along the word line conductive layer according to the third embodiment.

As shown in FIG. 5c, in one embodiment, the air gap structure 114 in the first insulating layer 116 has an elliptical shape (an air gap), and the degree of sidewall etching of the first trench in the shallow trench isolation region can be controlled, thus the opening of the first trench expands more, and the step coverage of the first insulating film can be adjusted to improve the first insulating film filling capability into the first trench as the opening is slightly expanded, so that the air gap structure is limited to stay in the first insulating layer in the second trench of the active region 202. The air gap structure at this time is an elliptical shape independently distributed in the second trench. The air dielectric constant is 1.001, which is close to the vacuum dielectric constant. An elliptical air gap structure (an air gap) is formed in the first insulating layer above the word line conductive layer, so that the portion of the first insulating layer containing the air gap structure above the word line conductive layer has the effect of a low dielectric constant material. The overall effective dielectric constant of the insulating material which impacts the parasitic capacitance between the word line conductive layer and the bit line contact conductive layer or the capacitor contact conductive layer is reduced. However, the elliptical air gap structure has a small effect on the parasitic capacitance between the word line conductive layer and the bit line layers, thereby reducing the capacitance value of the parasitic capacitance between the word line conductive layer, the bit line contact conductive layer, and the capacitive contact conductive layer, and reducing the influence of the parasitic capacitance on the device performance parameters. In addition, the elliptical air gap structure is located in the first insulating layer in the second trench of the active area, and there is no risk of window opening when forming the word line contact holes. In addition, the first insulating layer has a stable structure and is not prone to stress induced film cracking.

In one embodiment, the aspect ratio of height to width of the air gap structure cross section is greater than or equal to 1.3 and less than or equal to 5.0, for example like 1.5, 1.7, 1.9, 2.0, 2.5, 2.7, 2.9, 3.0, 4.0, 4.5, 4.7, etc.

In one embodiment, the air gap structure 114 is located in the second trench 204.

In one embodiment, the semiconductor device is a dynamic random access memory.

The manufacturing method to make the above device includes: providing a substrate which has a shallow trench isolation region and an active region; patterning trenches in the shallow trench isolation region and in the active region respectively; forming a word line conductive layer on the substrate, where part of the word line conductive layer is located in the trench; forming a first insulating film on the word line conductive layer, where the step of making the first insulating film is controlled to form an air gap structure in the first insulating film, and the air gap structure is located in the trench; removing the first insulating film from the surface of the substrate to form a first insulating layer, where the first insulating layer embeds the air gap structure. By controlling the step coverage of the first insulating film, the air gap structure is formed in the first insulating layer on the word line conductive layer in the trench to reduce the overall dielectric constant of the insulating material between the word line conductive layer and other conductive layers. This reduces the parasitic capacitance between the word line conductive layer and the bit line conductive layer, the bit line contact conductive layer, and the capacitor contact conductive layer, thereby reducing the influence of the parasitic capacitance on the device performance parameters.

In one embodiment, a semiconductor device is provided, including:

A substrate, a shallow trench isolation region and an active region are formed on the substrate; a trench is formed in each of the shallow trench isolation region and the active region.

In one embodiment, the trench includes a first trench located in the shallow trench isolation region and a second trench located in the active region, and the depth of the first trench is greater than or equal to the second trench, the width of the first trench is greater than or equal to the width of the second trench. In one embodiment, the aspect ratio of depth to width of the first trench is less than or equal to the aspect ratio of depth to width of the second trench. In one embodiment, the aspect ratio of depth to width of the first trench is greater than the aspect ratio of depth to width of the second trench.

A word line conductive layer, the word line conductive layer is located on the substrate, and a part of the word line conductive layer is located in the trench.

In one embodiment, there is a first metal layer between the word line conductive layer and the inner wall of the trench. For example, the first metal layer may be a titanium or a titanium nitride metal layer for adhesion and being a barrier.

In one embodiment, there is an insulating layer between the word line conductive layer and the inner wall of the trench, and the insulating layer may be a silicon oxide film.

In one embodiment, the word line conductive layer is a metal conductive layer, such as a metal tungsten conductive layer, a metal tungsten composite conductive layer, a metal aluminum conductive layer, and the like.

A first insulating layer, the first insulating layer is located on the word line conductive layer, a portion of the first insulating layer located in the trench is formed to include an air gap structure, and the first insulating layer embeds the air gap structure.

In an embodiment, the first insulating layer includes at least one high dielectric constant material such as silicon dioxide, silicon nitride, silicon oxynitride, or silicon carbide.

In one embodiment, the air gap structure in the first insulating layer includes a first air gap structure located in the shallow trench isolation region and a second air gap structure located in the active region. The depth of the first air gap structure is less than or equal to the depth of the second air gap structure.

In one embodiment, the air gap structure in the first trench in the shallow trench isolation region is smaller than the air gap structure in the second trench in the active region.

In an embodiment, the shape of the air gap structure includes at least one of a short pipe shape (air pipe), an elongated shape (air line), and an elliptical shape (air gap). The shape of the air gap structure in the first insulating layer is controlled by controlling the degree of side etching of the first trench in the shallow trench isolation region. At the same time, avoid forming an air gap structure above the word line contact landing area 115 (word line end). The word line contact landing area refers to the part of the word line conductive layer at the end of the word line that is used to lead out the word line conductive layer through the word line contact hole. That is, to avoid forming abnormal window opening when making subsequent word line contact holes or forming air gap structures on the sidewall of the word line contact hole in the first insulating layer, because these will make a bad interlayer interconnection line, which affects the device performance.

The word line conductive layer divides the first trench into a word line conductive layer part and a third trench, and divides the second trench into a word line conductive layer part and a fourth trench.

In one embodiment, the aspect ratios of depth to width of the third trench in the shallow trench isolation region and the fourth trench in the active region are both greater than 1.5, and the air gap structure in the first insulating layer is a continuous strip shape (an air line).

In one embodiment, the aspect ratio of depth to width of the third trench in the shallow trench isolation region is less than 1.5 and great than 1.0, the aspect ratio of depth to width of the fourth trench in the active region is greater than 1.5, and the air gap in the first insulating layer has an intermittent short pipe shape (air pipe).

In one embodiment, the aspect ratio of depth to width of the third trench 103 in the shallow trench isolation region is less than 1.0, the aspect ratio of depth to width of the fourth trench in the active region 202 is greater than 1.5, and the air gap structure in the first insulating layer has an independent elliptical shape (air gap).

In one embodiment, the aspect ratio of height to width of the cross section of the air gap structure is greater than or equal to 1.3 and less than or equal to 5.0, is like 1.5, 1.7, 1.9, 2.0, 2.5, 2.7, 2.9, 3.0, 4.0, 4.5, 4.7, etc.

In one embodiment, the air gap structure is located in the second trench.

In one embodiment, the semiconductor device is a dynamic random access memory.

The semiconductor device described above includes: a substrate on which a shallow trench isolation region and an active region are formed; trenches are formed on both the shallow trench isolation region and the active region; a word line conductive layer, where the word line conductive layer is located on the substrate and part of the word line conductive layer is located in the trench; a first insulating layer, located on the word line conductive layer, an air gap structure is formed in a portion of the insulating layer located in the trench, and the first insulating layer embeds the air gap structure. By forming an air gap structure in the first insulating layer over the word line conductive layer in the trench, the overall dielectric constant of the insulating material between the word line conductive layer and other conductive layers is reduced, thereby lowering the parasitic capacitance between the word line conductive layer and other conductive layers and reducing the influence of parasitic capacitance on device performance parameters.

The technical features of the above-mentioned embodiments can be combined arbitrarily. In order to make the description concise, not all possible combinations of the various technical features in the above-mentioned embodiments are described. However, as long as there is no contradiction in the combination of these technical features, they should be considered as within the scope of this specification.

The above-mentioned embodiments only express several implementation modes of the present invention, and the description is relatively specific and detailed, but it should not be understood as a limitation on the scope of the invention patent. It should be pointed out that for those of ordinary skill in the art, without departing from the concept of the present invention, several modifications and improvements can be made, and these all fall within the protection scope of the present invention. Therefore, the protection scope of the patent of the present invention should be subject to the appended claims.

What is claimed is:

1. A method for manufacturing a semiconductor device, comprising steps of:
   providing a substrate comprising a shallow trench isolation region and an active region on a top surface;
   forming trenches in the shallow trench isolation region and in the active region respectively, the trenches comprising a first trench located in the shallow trench isolation region and a second trench located in the active region, wherein a depth of the first trench is greater than or equal to a depth of the second trench, and a width of the first trench is greater than or equal to a width of the second trench;
   forming a word line conductive layer on the substrate, wherein a part of the word line conductive layer is located in each of the trenches;
   forming a first insulating thin film on the word line conductive layer in which an air gap structure is formed in the first insulating thin film by controlling a step coverage of the first insulating thin film; and
   removing the first insulating thin film from the top surface of the substrate to form a first insulating layer, wherein the first insulating layer embeds the air gap structure; and
   wherein the air gap structure is avoided to form above word line contact landing area, wherein the word line contact landing area refers to end of the word line conductive layer.

2. The method according to claim 1, wherein the air gap structure in the first insulating layer comprises a first air gap structure in the shallow trench isolation region and a second air gap structure in the active region, wherein a depth of the first air gap structure is less than or equal to a depth of the second air gap structure.

3. The method according to claim 2, wherein the first air gap structure in the shallow trench isolation region is an intermittent structure along the extension direction of the trenches.

4. The method according to claim 1, wherein a shape of the air gap structure comprises at least one of a short pipe shape and an elliptical shape.

5. The method according to claim 1, wherein an aspect ratio of height to width of a cross section of the air gap structure is greater than or equal to 1.3 and less than or equal to 5.0.

6. The method according to claim 1, wherein the step of forming the word line conductive layer on the substrate comprises:
   forming a conductive film on the top surface of the substrate and the trenches; and
   etching an excess conductive film from the top surface of the substrate and the trench to form the word line conductive layer.

7. The method according to claim 1, wherein the semiconductor device is a dynamic random access memory.

8. The method according to claim 1, wherein the air gap structure in the first insulating thin film is only located in the second trench in the active region.

9. The method according to claim 1, wherein the air gap structure is an intermittent structure along the extension direction of the trenches.

10. A semiconductor device, comprising:
    a substrate, a shallow trench isolation region and an active region formed on the substrate;
    trenches respectively located in the shallow trench isolation region and the active region, and the trenches comprising a first trench located in the shallow trench isolation region and a second trench located in the active region, wherein a depth of the first trench is greater than or equal to a depth of the second trench, and a width of the first trench is greater than or equal to a width of the second trench;
    a word line conductive layer located on the substrate, wherein a part of the word line conductive layer is located in each of the trenches;
    a first insulating layer disposed on the word line conductive layer, wherein an air gap structure is formed in a portion of the first insulating layer, and wherein the first insulating layer embeds the air gap structure; and
    the air gap structure is avoided to form above word line contact landing area, wherein the word line contact landing area refers to end of the word line conductive layer.

11. The device according to claim 10, wherein the air gap structure in the first insulating layer comprises a first air gap structure in the shallow trench isolation region and a second air gap structure in the active region, wherein a depth of the first air gap structure is less than or equal to a depth of the second air gap structure.

12. The device according to claim 11, wherein the first air gap structure in the shallow trench isolation region is an intermittent structure along the extension direction of the trenches.

13. The device according to claim 10, wherein a shape of the air gap structure includes at least one of a short pipe shape and an elliptical shape.

14. The device according to claim 10, wherein an aspect ratio of height to width of a cross section of the air gap structure is greater than or equal to 1.3 and less than or equal to 5.0.

15. The device according to claim 10, wherein the semiconductor device is a dynamic random access memory.

16. The device according to claim 10, wherein the air gap structure in the first insulating layer is only located in the second trench in the active region.

17. The device according to claim 10, wherein the air gap structure is an intermittent structure along the extension direction of the trenches.

* * * * *